United States Patent

Lyons et al.

[15] 3,658,606

[45] Apr. 25, 1972

[54] DIFFUSION SOURCE AND METHOD OF PRODUCING SAME

[72] Inventors: Vincent J. Lyons, Poughkeepsie; Jagtar S. Sandhu, Fishkill, both of N.Y.

[73] Assignee: International Business Machines Corporation, Armonk, N.Y.

[22] Filed: Apr. 1, 1969

[21] Appl. No.: 811,931

[52] U.S. Cl. ....... 148/187
[51] Int. Cl. ....... H01l 7/36, H01l 7/44
[58] Field of Search ....... 148/186, 189, 1.5

[56] References Cited

UNITED STATES PATENTS

| | | | |
|---|---|---|---|
| 3,065,113 | 11/1962 | Lyons | 148/175 |
| 2,870,050 | 1/1959 | Mueller et al. | 148/188 |
| 2,956,913 | 10/1960 | Mack et al. | 148/189 |
| 2,975,080 | 3/1961 | Armstrong | 148/188 |
| 3,167,461 | 1/1965 | Compton | 148/189 |

*Primary Examiner*—Hyland Bizot
*Attorney*—Hanifin and Jancin and Wolmar J. Stoffel

[57] ABSTRACT

A homogeneous diffusion source and method of producing wherein a semiconductor dopant material and a finely divided semiconductor material are introduced into a capsule in spaced relation, the capsule evacuated, and the capsule introduced into a multiple-zone furnace. The temperature of the semiconductor material and the dopant material are maintained until equilibrium is substantially achieved.

7 Claims, 4 Drawing Figures

INVENTORS
VINCENT J. LYONS
JAGTAR S. SANDHU
BY Wolmar J. Stoffel
ATTORNEY

DIFFUSION SOURCE AND METHOD OF PRODUCING SAME

BACKGROUND OF THE INVENTION

1. Field of the Invention

The invention relates to the manufacture of semiconductor devices more particularly to diffusion operations for forming P and N type regions in such devices. More specifically, the invention relates to a dopant source adapted for capsule diffusion operations which has a predictable dopant vapor pressure.

2. Description of the Prior Art

Capsule diffusion is well-known in the semiconductor manufacturing art. In general wafers, properly masked, are introduced into a quartz capsule along with a dopant source, and the capsule evacuated and sealed. The capsule is then placed in a furnace where the dopant source and wafers are heated to temperatures in the range of 800° to 1,100° C. At such temperatures the dopant is vaporized from the source and the vapor is diffused into the wafers.

As semiconductor devices become more miniaturized, and performance requirements are increased, there is an increasing need for greater precision in the control of diffusion depth and profile characteristics. For tighter control on diffusion of an impurity into a semiconductor in any diffusion process the following parameters must be controlled (1) temperature of the diffusion (2) time of the diffusion and (3) dopant source behavior. The first two of the aforementioned parameters can be accurately controlled in existing equipment. The third parameter, namely the dopant source behavior is vital and most difficult to control, and hence requires special consideration. The mechanism of the source behavior in the capsule diffusion may be expressed by the equilibrium system;

Source $\leftrightarrows$ impurity vapors $\leftrightarrows$ wafer surface concentration $\leftrightarrows$ diffusion phenomena For a controlled diffusion phenomena the wafer surface concentration must be controlled and hence the impurity vapor pressure behavior of the source.

It is very inconvenient to control the dopant vapor pressure behavior by using an elemental dopant in capsule diffusion since the dopant weight involved may be extremely small and the vapor pressure would change with diffusion time. Accordingly, the dopant impurity is conventionally incorporated into intrinsic silicon and the pulverized material is used as a diffusion source. A number of techniques are known for incorporating the dopant impurity into silicon.

The simplest method for making a diffusion source, is to prepare a mechanical mixture of pulverized dopant, as for example arsenic, and intrinsic silicon. This type of source is not homogeneous. Consequently, upon heating the vaporized dopant and the silicon interact during the diffusion process due to the simultaneous dopant diffusion into the silicon powder. Thus the vapor pressure of the dopant would vary with time in the capsule and can not be accurately predicted or controlled.

Another method of preparing a source is the freeze-out source method. Here the source is prepared by dissolving a measured amount of dopant, typically arsenic, into molten silicon. The dopant is allowed to melt and the mixture is then frozen. Because of the large difference in boiling point of the two components large quantities of the dopant boil from the molten mixture before the melt is frozen. This gives a time dependence on the concentration of the source. Further since the freezing of the source is relatively rapid the system does not reach an equilibrium state and a number of different phases of the resultant mixture can be expected. Each of these phases will have a different vapor pressure. Thus it is difficult, if not impossible, to obtain uniformity between different batches of sources, or even samples from the same freeze-out batch, which will have a consistent dopant vapor pressure performance. Any variation in the freeze-out composition or method of preparation will have a marked effect on the resultant vapor pressure of the dopant.

Vapor diffusion sources are also prepared by pulling a crystal from a molten mixture of silicon and dopant followed by pulverization of the crystals. This technique tends more toward equilibrium when compared to the freeze-out method. However, at high dopant concentrations, constitutional supercooling of the melt can cause the incorporation of varying quantities of the dopant impurity and can result in the formation of non-equilibrium phases in the solid crystal. Consequently, a diffusion source prepared from this material will exhibit unpredictable variations in dopant vapor pressure as a function of time. Hence, the impurity diffusion gradients produced in wafers exposed to this diffusion source cannot be controlled or predicted accurately.

Sources prepared from the three abovementioned techniques suffer from grave limitations. Because of their uncontrolled multiphase nature, it is difficult to reproduce exactly the same source composition. Thus each source will produce a different set of diffusion conditions.

The increased interest in arsenic doped emitters has produced an unprecedented demand for arsenic sources for use in capsule diffusion. The usual freeze-out method is not capable of producing arsenic sources which will have a sufficiently predictable and consistent vapor pressure. A new type diffusion source and method for making same is required to enable the manufacture of high speed, high performance semiconductor devices utilizing arsenic emitters. The three aforementioned known techniques do not produce sources which have sufficient predictability and reproducibility of vapor pressure necessary to accurately produce diffused regions in semiconductors having the desired characteristic profile.

SUMMARY OF THE INVENTION

An object of this invention is to provide source material for semiconductor capsule diffusion operations which will produce a predictable vapor pressure.

Another object of this invention is to produce a source material for capsule diffusions which has a phase composition which will exhibit a predictable vapor pressure.

Another object of this invention is to provide a homogeneous dopant source having a predictable vapor pressure.

In accordance with the aforementioned objects a method of producing source material involves introducing into a capsule in spaced relation a dopant material and a finely divided semiconductor material. The capsule is sealed and evacuated and subsequently introduced into a multiple-zone furnace. The temperature of the semiconductor material and the dopant material are maintained until equilibrium is substantially achieved within the environment of the capsule.

BRIEF DESCRIPTION OF THE DRAWINGS

The foregoing and other objects, features, and advantages of the invention will be apparent from the following more particular description of preferred embodiments of the invention as illustrated in the accompanying drawings.

DESCRIPTION OF THE PREFERRED EMBODIMENTS

Figure 1:
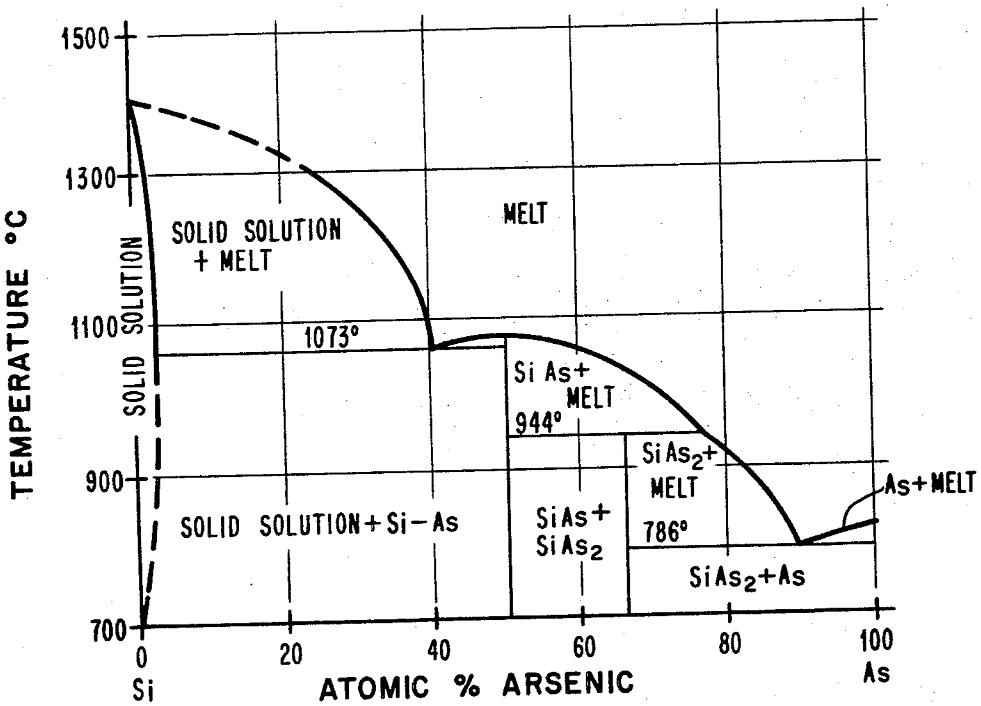
FIG. 1 is a diagram depicting the various equilibrium phases of a silicon-arsenic mixture.

The phase diagram of FIG. 1 illustrates why source materials made in accordance with the aforementioned methods known to the prior art fail to produce a uniform reproducible vapor pressure in a capsule diffusion. When a silicon arsenic mixture is heated and subsequently cooled under nonequilibrium conditions the resultant mixture will include some amounts of many or all of the solid compositions shown in the diagram. Each of the solid compositions has its own individual vapor pressure. When the source is subsequently heated in a diffusion capsule to a given temperature each of the materials will vaporize at its own pressure. Further, during the diffusion operation the vaporized dopant must in addition to diffusing into the semiconductor wafer, establish an equilibrium within the source. Thus significant fluctuations in the vapor pressure will occur within the chamber which in turn results in different surface impurity concentrations at the surface of a wafer at different times of a diffusion. Other combinations of dopants and semiconductor materials generally have similar phase diagrams which predict that a number of compositions are formed under equilibrium conditions. The different compositions within each system have different vapor pressures which present similar problems in semiconductor diffusion operations.

There are a number of alternate methods of preparing the homogeneous sources of the invention. In general a relatively large amount of semiconductor material is subjected for a prolonged time interval to vaporized dopant material within a closed evacuated container for a sufficient time to allow the environment within the container to achieve a condition of substantial equilibrium.

A mixture of elemental dopant and semiconductor powder can be sealed in an evacuated chamber and heated. However, in order to be practical the semiconductor material must be heated to a temperature sufficient that the dopant will diffuse into the material at a reasonable rate. When the dopant and the semiconductor are mixed together the temperature sufficient to obtain a reasonable diffusion rate of the dopant into the semiconductor material could result in a very high pressure from the vaporized dopant material which may destroy the chamber, depending on the intrinsic vapor pressure of the dopant.

In practicing the method of the invention any suitable dopant can be combined with any suitable semiconductor material to form a homogeneous source. Typical dopant materials suitable for use in the practice of the invention are phosphorus, arsenic, antimony, boron, gallium, and indium for suitable semiconductor materials such as silicon and germanium.

Typical dopant materials for III – V compounds such as GaAs, InP, GaP, and InAs, as well as related ternary compounds such as $GaAs_x$, $P_{1-x}$ and $Ga_x Al_{1-x}$ As are zinc, cadmium, selenium and tellurum.

Figure 2:
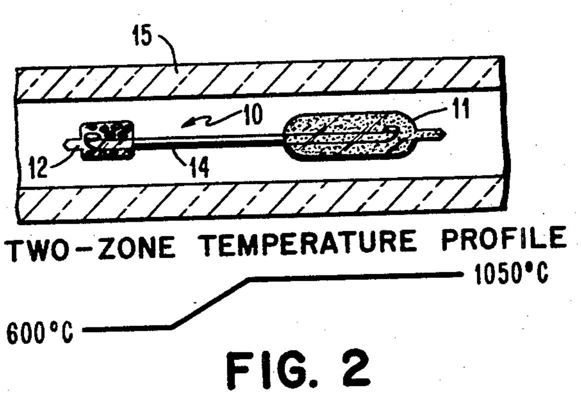
FIG. 2 is a schematic diagram of a two-zone furnace and a typical temperature profile, which furnace is used in carrying out the method of the invention.
Figure 3:
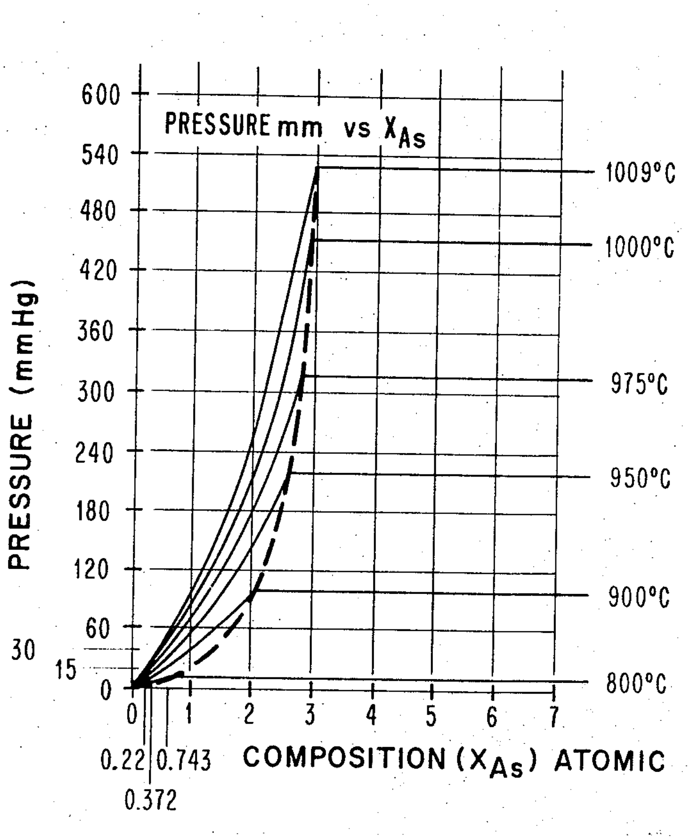
FIG. 3 is a graph showing the correlation between pressure, temperature and compositions of silicon-arsenic alloys.

FIG. 2 illustrates schematically an apparatus suitable for carrying out the method of the invention. While the method could be used to produce other source materials, the preferred embodiment will be addressed to a source material consisting of arsenic in silicon. In the method the semiconductor material, typically silicon, is ground into a powder preferably having a particle size less than 149 microns. The powder is placed into the end portion 11 of elongated capsule 10, as shown in FIG. 2. Arsenic is placed in the opposite end of capsule 10 in portion 12. As indicated in FIG. 2 the preferred capsule is made of quartz having two chambers 11 and 12 joined by a smaller tube 14. The dopant, preferably arsenic can be elemental arsenic, a mixture of elemental arsenic and semiconductor material, or any dopant source produced by the methods known in the prior art, as for example, the freeze-out method, the recrystallization method, or the like. Capsule 10 is evacuated to a low pressure, preferably less than $5 \times 10^{-6}$ millimeters of mercury, heated, and sealed. The capsule 10 is placed in a two-zone furnace 15 and heated. In the furnace the temperature of the end portion 12 containing the dopant is maintained at a temperature sufficient to produce a vapor pressure which will not rupture the capsule. The temperature of the end portion 11 of capsule 10 containing the semiconductor powder is maintained at a significantly higher temperature which permits diffusion of the vaporized dopant into the material at an appreciable rate. As indicated in FIG. 2 in forming an arsenic source the elemental arsenic is maintained at a temperature of approximately 600° C. while the silicon powder is maintained at a temperature of 1,050° C. In general, in producing an arsenic dopant source the temperature of the arsenic in the two-zone furnace is maintained in the range of 300° to 700° C., more preferably 500° to 650° C., most preferably 500° to 600° C. The silicon is maintained at a temperature in the range of 700° to 1,100° C., more preferably 800° to 1,050° C., most preferably 1,050° C. In producing the dopant source the temperatures of the respective dopant and semiconductor will depend upon the dopant source vapor pressure and the diffusivity of the semiconductor material.

The aforementioned technique can be utilized either to make a master source which normally would have a relatively high atomic percent of dopant in the semiconductor material. This master batch would then be used to produce dopant sources having a much lower atomic percentage of dopant. However, the final dopant source having the desired ratio of dopant to semiconductor powder can be produced directly in the two-zone method.

The material of the master source is mixed with the semiconductor material and placed in a single container and heated in a single zone furnace. The composition of the master source can be initially adjusted so that the vapor pressure is less than two atmospheres at the temperature of the furnace. In producing an arsenic source the temperature of the furnace when the master source is mixed with the powder is preferably 1,050° C.

Alternately the master source can then be placed in portion 12 of capsule 10 and freshly ground semiconductor powder placed in portion 11. The capsule is placed in a two-zone furnace and reheated. The master source has its own distinctive vapor pressure which is less than the elemental dopant. Accordingly, the temperatures in the two-zone furnace can be adjusted accordingly.

The master source in an arsenic source will include from four to fifty atomic percent of arsenic. As indicated in FIG. 1 of the drawings, any concentration above the solid solution line up to 50 percent of arsenic in silicon, the equilibrium mixture will include a solid solution plus SiAs. The vapor pressure of either the solid solution or the silicon arsenide at temperatures below 1,050° C. does not substantially exceed one atmosphere. This pressure can be contained in a conventional quartz capsule. The master source is then combined with additional powdered semiconductor material and mixed so that the total atomic percent of arsenic is in the range of 0.02 to 4 percent.

When producing the homogenized source directly the desired atomic percent of arsenic is placed in portion 12 of capsule 10 and the desired atomic percent of arsenic is placed in portion 11. The capsule is then placed in a two-zone furnace as shown in FIG. 2 and the source allowed to come to equilibrium.

The following are specific examples of practicing the method of the present invention. The examples are included merely to aid in the understanding of the invention, and variations may be made by one skilled in the art without departing from the spirit and scope of the invention.

EXAMPLE I

A homogenized arsenic diffusion source was prepared by first preparing a master source having 10 atomic percent arsenic. Intrinsic silicon was ground to less than a 149 micron (100 mesh size) particles. Two hundred fifty-two grams of the silicon powder were loaded into portion 11 of a quartz capsule of the type shown in FIG. 2. Seventy-five grams of elemental arsenic were loaded into portion 12 of the capsule. The capsule was then placed in a two-zone furnace where the portion 12 was heated at 600° C. for 8 hours and 625° C. for 16 hours. Portion 11 was maintained at a temperature of 1,050° C. for the entire 24 hour period. Following the heating period 32.7 grams of the master source was combined with 252 grams of finely divided silicon powder. The mixture was thoroughly mixed and placed into a simple single unit capsule and heated at 1,050° C. for 50 hours. The resultant source contained one atomic percent of arsenic.

EXAMPLE II

An arsenic homogenized diffusion source was prepared by the single step method wherein 252 grams of finely divided silicon powder was loaded into portion 11 of capsule 10 and 7.5 grams of arsenic was loaded into portion 12. The capsule was then placed in a two-zone furnace and portion 12 heated for 55 hours at a temperature of 600° C. and 5 hours at 1,050° C. The portion 11 was maintained at 1,050° C. for the entire 60 hour period. At the end of the heating period the capsule was removed, cooled, and the diffusion source removed. During the heating step substantially all of the arsenic was vaporized and diffused into the silicon powder. The resultant diffusion source contained approximately 1 atomic percent arsenic and 99 percent silicon.

EXAMPLE III

Figure 4:
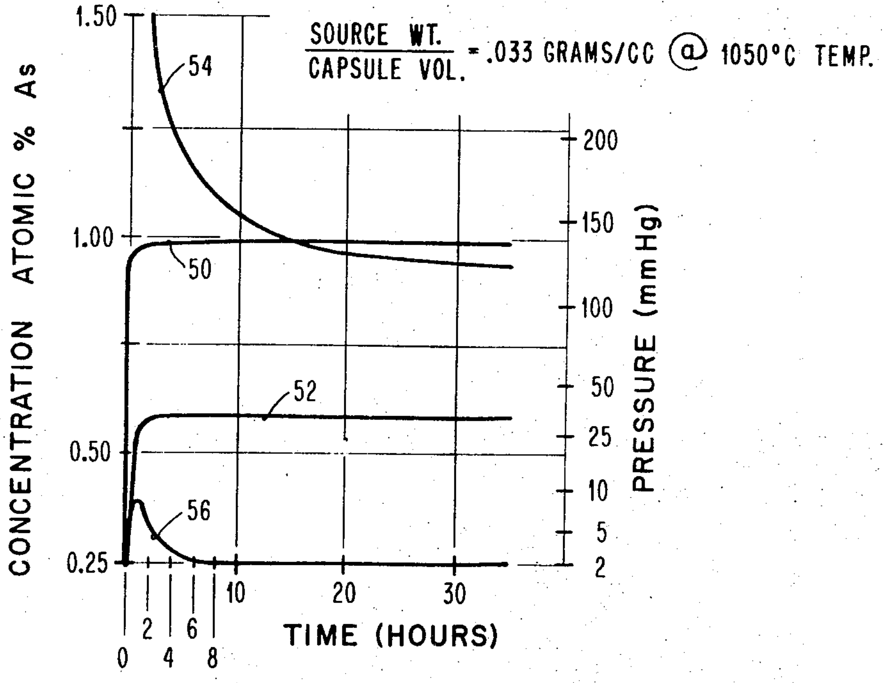
FIG. 4 is a plot of concentration and vapor pressure of arsenic in silicon versus time for arsenic sources produced by differing methods including the method of the invention.

The behavior of the source prepared in Example I was determined under typical diffusion conditions utilizing an apparatus consisting of a quartz manifold connected to a spoon-shaped Bourdon gauge which was highly sensitive to pressure differentials. The spoon gauge was surrounded by a jacket which could be attached to a mercury manometer. The source cavity was filled with 0.033 grams per cc. of cavity volume of the arsenic source prepared in Example I. The apparatus was then attached to a high vacuum system so that both sides of the Bourdon gauge would be evacuated simultaneously to a pressure of less than $5 \times 10^{-6}$ millimeters of mercury. The source cavity and the entire Bourdon tube was then baked at 430° C. for 60 minutes, cooled and sealed under vacuum. The apparatus was then placed in a furnace and heated at a temperature of 1,050° C. for a period of 28 hours. The pressure within the source cavity and the temperature of the source material in the furnace was monitored throughout the entire time of the experiment. The results were plotted and appear as curve 50 on FIG. 4 of the drawings. As the figure indicates the dopant vapor pressure remained essentially constant after the initial warm-up period.

EXAMPLE IV

A 0.58 atomic percent arsenic homogeneous diffusion source was placed in the same apparatus described in Example III. The source was heated at the same temperature and the vapor pressure monitored. The results are plotted on FIG. 4 which appears as curve 52. As is evident, the pressure remained essentially constant after the initial warm-up period.

EXAMPLE V

A one atomic percent arsenic diffusion source was prepared by the prior art freeze-out method described previously in the specification. The source was prepared in accordance with the techniques known to the prior art. This freeze-out source was placed in the same apparatus described in Example III, heated at the same temperature, and the resultant vapor pressure plotted on FIG. 4 as curve 54. As indicated the vapor pressure of the source varied continuously for the first 30 hours of heating.

EXAMPLE VI

An arsenic dopant source having a 0.25 atomic percent arsenic content was tested in the same manner and in the same apparatus described in Example III. The source was prepared by grinding an arsenic doped grown silicon crystal in the manner disclosed previously. This doped crystal source was prepared in accordance with prior art technique. The results appear as curve 56 in FIG. 4. As indicated the dopant vapor pressure varied significantly with time.

EXAMPLE VII

A homogeneous source embodying 0.1 atomic percent phosphorus was prepared using the master source method. Thirty-one grams of red phosphorus was put in one end of a quartz capsule and 250 grams of finely divided silicon in the other. The capsule was placed in a two-zone furnace where the end containing the phosphorus was heated at 450° C. and the end containing the silicon at 1,050° C. The heating was maintained for 24 hours. At the end of the 24 hour period the capsule was removed and the master source containing 10 atomic percent phosphorus allowed to cool. 2.83 grams of the master source were combined with 278 grams of finely divided silicon. The mixture was heated at 1,050° C. for 48 hours.

EXAMPLE VIII

The source prepared in Example VII containing 0.1 atomic percent phosphorus was placed in a capsule with a wafer having a low background impurity concentration of $5 \times 10^{15}$ atoms per cc. The capsule was heated to 1,050° C. for 105 minutes. The surface concentration of the wafer was measured and determined to be $5 \times 10^{19}$ atoms per cc. which indicated that the atomic percent of phosphorus in the surface layer was 0.1 atomic percent which is essentially the same as the source. This indicated that the vapor pressure within the capsule was constant with time with no significant pressure variations.

EXAMPLE IX

A homogeneous diffusion source containing 0.3 atomic percent Boron was prepared by combining 0.33 grams of boron with 280 grams of finely divided silicon. The mixture was thoroughly mixed, placed in a capsule and heated at 1,050° C. for 50 hours. The heating could be accomplished in a single zone furnace because the vapor pressure of boron is relatively low. The reproducibility of the source was tested by preparing a number of sealed capsules containing a portion of the source and a wafer. The capsules were then each heated at a different temperatures from 950° to 1,200° C. for a period of from two to three hours. The surface impurity concentration of each wafer was measured. All of the surface concentrations of the wafers compared to the source, which indicates that constant vapor pressures were produced by the sources in each capsule at each respective temperature.

EXAMPLE X

A 0.1 atomic percent antimony homogeneous diffusion source was prepared by mixing 1.22 grams of antimony with 280 grams of finely divided silicon. The silicon and antimony were thoroughly mixed and placed in a capsule which was heated at 1,050° C. for 50 hours. Evaluation of the resultant sample in the manner set forth in Example IX indicated that a uniform predictable vapor pressure resulted.

While the invention has been particularly shown and described with reference to preferred embodiments thereof, it will be understood by those skilled in the art that various changes in form and detail may be made therein without departing from the spirit and scope of the invention.

We claim:

1. A method of producing a homogeneous dopant source for a capsule type diffusion operation comprising:

introducing into an elongated container finely ground semiconductor material and a vaporizable source of a semiconductor dopant material, locating the semiconductor material and the dopant material in spaced relation in the container, evacuating and sealing the container, heating the dopant material to a first temperature sufficient to establish a significant vaporization rate and a pressure which can be contained by the container and simultaneously heating the semiconductor material to a second temperature that is higher than the first temperature, maintaining the dopant material and semiconductor material at the selected temperatures for a time sufficient to establish a condition of substantial equilibrium within the container, the ratio of the amount of dopant material to the semiconductor material in the container being such that when an equilibrium condition is substantially achieved a single phase alloy of the dopant material and semiconductor material is produced, which alloy upon being reheated will produce a constant dopant vapor pressure.

2. The method of claim 1 wherein said dopant material is selected from the group consisting of P, As, Sb, and B.

3. The method of claim 2 wherein said semiconductor material is silicon.

4. The method of claim 1 wherein said semiconductor material is silicon and said dopant material is phosphorus.

5. The method of claim 1 wherein the semiconductor material is silicon and the dopant material is arsenic.

6. The method of claim 2 wherein said first temperature is in the range of 500° to 800° C. and said second temperature is in the range of 800° to 1,070° C.

7. A method of producing a homogeneous dopant source for a capsule type diffusion operation comprising;

introducing into an elongated container finely ground silicon material and a vaporizable source of arsenic dopant material, locating the silicon material and the arsenic material in spaced relation in the container, the ratio of arsenic material to silicon material being in the range of 4 to 50 atomic percent, evacuating and sealing the container, heating the arsenic to a first temperature sufficient to establish a significant vaporization rate at a pressure which can be contained by the container, and simultaneously heating the silicon material to a second temperature that is higher than the first temperature, removing the resultant master source from the container and combining with additional silicon to produce a mixture having 0.1 to 4 atomic percent arsenic, heating the resultant mixture in a container for a time sufficient to establish a condition of substantial equilibrium within the container, the ratio of the amount of arsenic material to the silicon material in the container being such that when an equilibrium condition is substantially achieved a single phase alloy of arsenic and silicon is produced, which alloy upon being reheated will produce a constant arsenic vapor pressure.

* * * * *